(12) United States Patent
Lai

(10) Patent No.: US 12,387,813 B2
(45) Date of Patent: Aug. 12, 2025

(54) METHOD AND SYSTEM FOR DETECTING MEMORY ERROR, AND DEVICE

(71) Applicant: KINGTIGER Testing Technology (SZ) Ltd., Shenzhen (CN)

(72) Inventor: Bosco Chun Sang Lai, Shenzhen (CN)

(73) Assignee: KINGTIGER Testing Technology (SZ) Ltd., Shenzhen (CN)

( * ) Notice: Subject to any disclaimer, the term of this patent is extended or adjusted under 35 U.S.C. 154(b) by 140 days.

(21) Appl. No.: 18/485,277

(22) Filed: Oct. 11, 2023

(65) Prior Publication Data

US 2024/0212783 A1 Jun. 27, 2024

(30) Foreign Application Priority Data

Dec. 23, 2022 (CN) .......................... 202211659866.4

(51) Int. Cl.
*G11C 29/56* (2006.01)

(52) U.S. Cl.
CPC .. *G11C 29/56008* (2013.01); *G11C 29/56004* (2013.01); *G11C 2029/5604* (2013.01)

(58) Field of Classification Search
CPC ........ G11C 29/56008; G11C 29/56004; G11C 2029/5604; G11C 29/56; Y02D 10/00
USPC .......................................................... 365/201
See application file for complete search history.

(56) References Cited

U.S. PATENT DOCUMENTS

| | | | |
|---|---|---|---|
| 2007/0140025 A1* | 6/2007 | Chan ........................ | G11C 5/04 365/201 |
| 2008/0301509 A1* | 12/2008 | Lai ......................... | G11C 29/16 714/724 |
| 2009/0115443 A1* | 5/2009 | Lai ......................... | G11C 29/56 324/762.02 |
| 2011/0179324 A1* | 7/2011 | Lai ......................... | G11C 29/56 714/723 |
| 2013/0058178 A1* | 3/2013 | Lai ................... | G11C 29/50012 365/201 |

* cited by examiner

*Primary Examiner* — Ly D Pham

(57) ABSTRACT

Disclosed are a method and system for detecting a memory error, and a device. The method includes: taking an application platform as a test engine of a memory test device, the application platform being provided with a system memory; capturing, by the memory test device, a data flow of an actual application program of the application platform on a memory transmission line in a manner including a logic analyzer; and taking, by the memory test device, a processed data flow as a memory test vector to test a tested memory device, thereby reproducing a memory error of the application platform or the application program on the memory test device. The present disclosure can reproduce all tested memory devices with an error in the application platform, and improves a reproduction rate for the memory error.

15 Claims, 2 Drawing Sheets

---

Take an application platform as a test engine of a memory test device, the application platform being provided with a system memory — S1

Capture, by the memory test device, a data flow of an actual application program of the application platform on a memory transmission line in a manner including a logic analyzer — S2

Take, by the memory test device, a processed data flow as a memory test vector to test a tested memory device, thereby reproducing a memory error of the application platform or the application program on the memory test device — S3

METHOD AND SYSTEM FOR DETECTING MEMORY ERROR, AND DEVICE

TECHNICAL FIELD

The present disclosure belongs to the technical field of memory error detection, and particularly relates to a method and system for detecting a memory error, and a device.

BACKGROUND

Central processing units (CPUs) and memories are core components of all computing electronic products. The memory error is one of main causes for failure, malfunction or repair of the electronic products.

The memory error occurs probabilistically. Specifically, there are the following cases: (1) a fixed error, (2) an error due to a special factor or environment (for example, the error only occurs at a low temperature or a high voltage), (3) a coupling error (the memory error occurs for several factors, such as a special temperature, a special voltage and a special combination of memory data), and (4) a probabilistic error, for example, the memory error occurs every day, every week or every month, etc. The memory error is ascribed to many reasons. According to data of various memory suppliers, memories with an error have a reproduction rate of about 40% in average. Hence, analysis on reasons of the memory error and optimization on detection of the memory error are problems to be solved urgently.

In the prior art, the memory error is analyzed by automatic testing equipment (ATE) or by running a memory testing program on an application platform. However, the above methods are only applicable to the problematic memories having the reproduction rate of about 40% in average. For memories with an error in particular applications, the error is analyzed difficultly, and can only be analyzed by the expensive high-order logic analyzer and/or high-order digital storage oscilloscope (DSO). In addition, with massive use of a buffer system in modern computers, and layer-by-layer production lines, a time difference from the memory error to time when the system is affected and becomes abnormal cannot be computed. Therefore, it is labor-consuming and time-consuming to use the high-order logic analyzer and/or the high-order DSO to search a node with the memory error.

SUMMARY

An objective of the present disclosure is to provide a method and system for detecting a memory error, and a device, to at least solve the technical problem that problematic memories have a low reproduction rate (only 40% in average) for an error, and for memories with an error only in particular application scenarios, the error is analyzed difficultly in the prior art. By accurately recording an error point, an error position and historical behavioral data before an error, the present disclosure is beneficial for an operator of a memory chip and an application system to continuously improve memory test.

To achieve the above objective, the present disclosure adopts the following technical solutions:

According to a first aspect, the present disclosure provides a method for detecting a memory error, including:

taking an application platform as a test engine of a memory test device, the application platform being provided with a system memory;

capturing, by the memory test device, a data flow of an actual application program of the application platform on a memory transmission line in a manner including a logic analyzer; and taking, by the memory test device, a processed data flow as a memory test vector to test a tested memory device, thereby reproducing a memory error of the application platform or the application program on the memory test device.

In a possible implementation, the data flow includes at least a command, an address and/or a data sequence, and the command includes at least a read command and/or a write command.

In a possible implementation, when the write command on the memory transmission line is captured, the taking, by the memory test device, a processed data flow as a memory test vector to test a tested memory device includes:

transmitting, by the memory test device, the captured write command to a transmission line of the tested memory device according to a data writing address, a data writing sequence and a data writing time sequence of the application platform for testing; and recording, by the logic analyzer embedded into the memory test device, a data transmission process.

In a possible implementation, when the read command on the memory transmission line is captured, the taking, by the memory test device, a processed data flow as a memory test vector to test a tested memory device includes:

transmitting, by the memory test device, the read command and a data reading address captured from the application platform to the transmission line of the tested memory device according to a captured sequence and a captured time sequence;

receiving, by the memory test device, response data of the application platform for the read command and response data of the tested memory device for the read command; and comparing stored information in the two sets of the response data, determining that the tested memory device has an error if the stored information is inconsistent, and recording error information.

In a possible implementation, after the capturing, by the memory test device, a data flow of an actual application program of the application platform on a memory transmission line in a manner including a logic analyzer, the method further includes:

storing, by the memory test device, the data flow in a circular buffer region; and after the taking, by the memory test device, a processed data flow as a memory test vector to test a tested memory device, the method further includes:

stopping, by the memory test device, updating the circular buffer region and a pointer of the circular buffer region when detecting that the tested memory device has an error, and recording a present error node and historical data of the circular buffer region.

In a possible implementation, after the recording a present error node and historical data of the circular buffer region, the method further includes:

displaying, by the logic analyzer of the memory test device, the present error node and the historical data of the circular buffer region.

In a possible implementation, the stopping, by the memory test device, updating the circular buffer region includes:

stopping, by the memory test device, embedding a logic address in the circular buffer region, where embedding the logic address is stopped by the memory error and/or a test environment.

In a possible implementation, after the taking, by the memory test device, a processed data flow as a memory test vector to test a tested memory device, the method further includes:

outputting, by the memory test device, a trigger signal, thereby triggering a DSO to track a signal waveform when the memory error occurs.

According to a second aspect, the present disclosure provides a memory error detection device, including:

an engine setting module configured to take an application platform as a test engine of a memory test device, the application platform being provided with a system memory;

a data capturing module configured to capture, by the memory test device, a data flow of an actual application program of the application platform on a memory transmission line in a manner including a logic analyzer; and a memory testing module configured to take, by the memory test device, a processed data flow as a memory test vector to test a tested memory device, thereby reproducing a memory error of the application platform or the application program on the memory test device.

According to a third aspect, the present disclosure provides a system using the method in any possible implementation of the first aspect, including the memory test device, where the memory test device is connected to the application platform and the tested memory device; and the application platform is provided with the system memory and runs the application program; and the memory test device is configured to capture the data flow on the memory transmission line in the application platform, and take the processed data flow as the memory test vector to test the tested memory device.

According to a fourth aspect, the present disclosure provides a computer device, including a memory, a processor, and a transceiver that are sequentially in communication connection, where the memory is configured to store a computer program, the transceiver is configured to transmit and receive information, and the processor is configured to read the computer program to execute the method in any possible implementation of the first aspect.

According to a fifth aspect, the present disclosure provides a computer-readable storage medium, where an instruction is stored on the computer-readable storage medium, and the instruction runs on a computer to implement the method in any possible implementation of the first aspect.

According to a sixth aspect, the present disclosure provides a computer program product including an instruction, where when an instruction runs on a computer, the computer implements the method in any possible implementation of the first aspect.

The present disclosure is implemented by taking an application platform as a test engine of a memory test device, the application platform being provided with a system memory; capturing, by the memory test device, a data flow of an actual application program of the application platform on a memory transmission line in a manner including a logic analyzer; and taking, by the memory test device, a processed data flow as a memory test vector to test a tested memory device. With the application platform as the test engine of the memory test device, the tested memory device connected to the memory test device and the system memory in the application platform are located in a completely same digital environment, thereby reproducing all tested memory devices with an error in the application platform, and improving a reproduction rate of the memory error. By storing the captured data flow in the circular buffer region, and recording a node with an error and historical data in case of the memory error, the present disclosure accurately locates the node with the memory error and the data.

DETAILED DESCRIPTION OF THE EMBODIMENTS

To describe the technical solutions in the embodiments of the present disclosure or in the prior art more clearly, the present disclosure is described simply with reference to the accompanying drawings and the embodiments or descriptions in the prior art. Apparently, the accompanying drawings in the following description show merely some embodiments of the present disclosure, and those skilled in the art may still derive other drawings from these accompanying drawings without creative efforts. It should be noted here that the description of these examples is used to help understand the present disclosure, but does not constitute a limitation to the present disclosure.

Embodiments

An embodiment of the present disclosure provides a method for detecting a memory error, to solve the technical problem that problematic memories only have a reproduction rate of 40% in average, and for memories with an error only in applications, the error is analyzed difficultly in the prior art. With an application platform as a test engine of a memory test device, a tested memory device connected to the memory test device and a system memory in the application platform are located in a completely same digital environment. This can reproduce all tested memory devices with the error in the application platform, and improves a reproduction rate for the memory error. The method for detecting a memory error provided by the embodiment of the present disclosure will be described below in detail.

Figure 1:
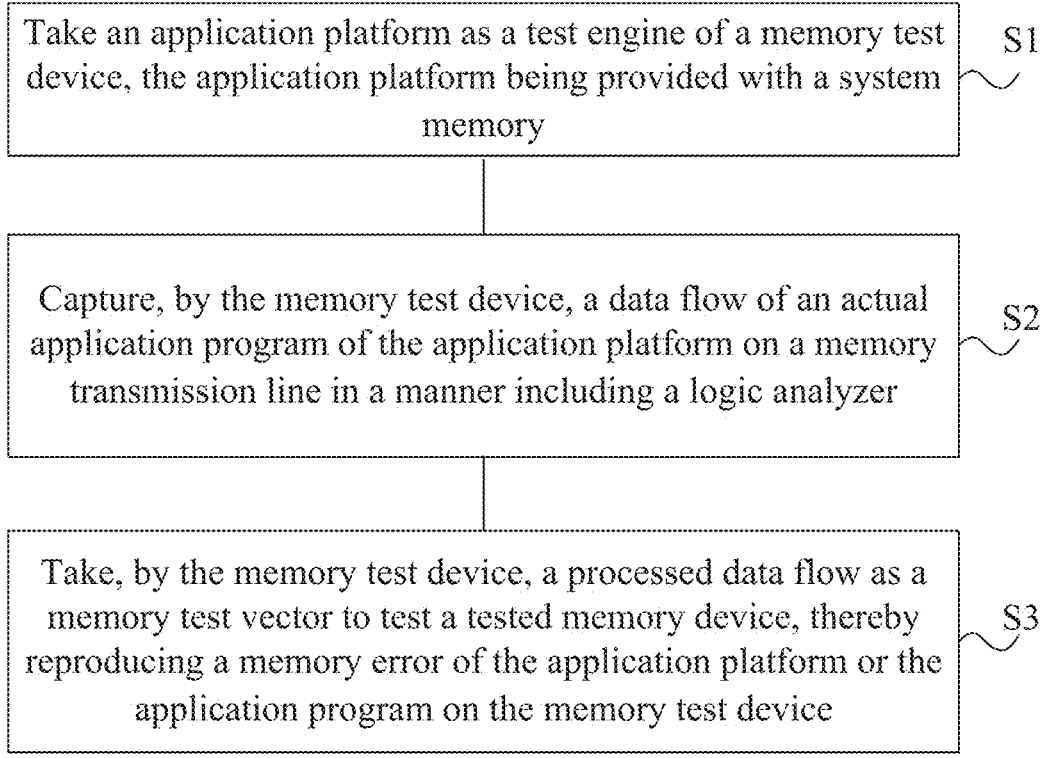
FIG. 1 is a flow chart of a method for detecting a memory error according to the present disclosure.
Figure 2:
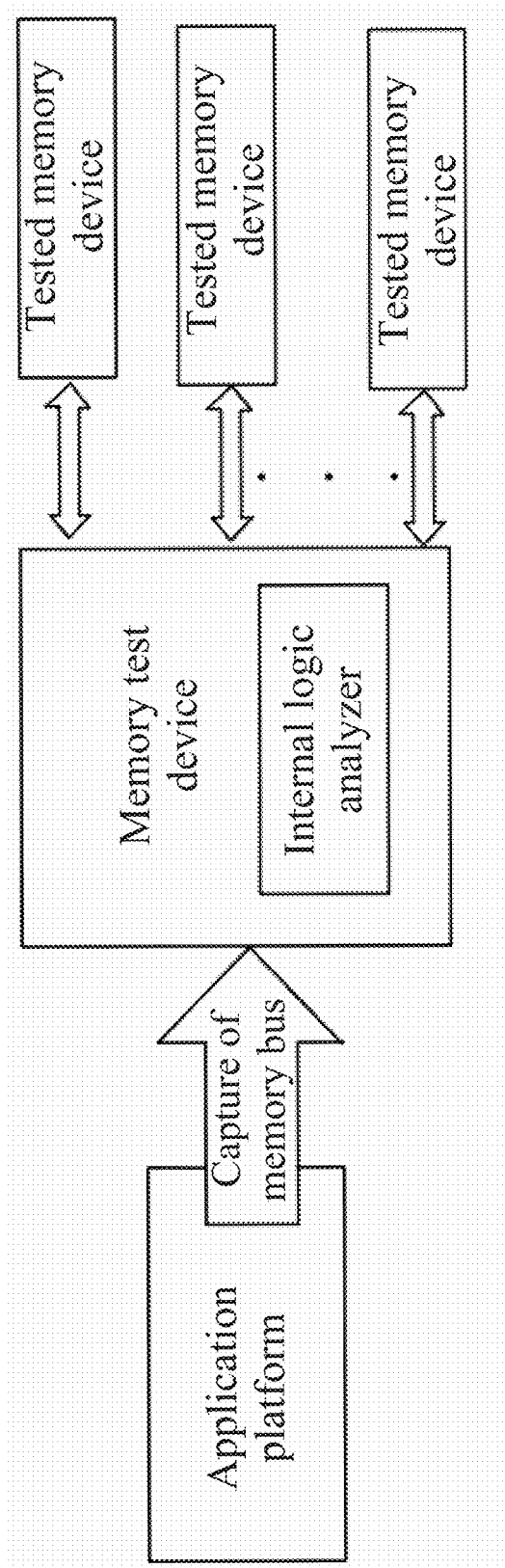
FIG. 2 is a structural block view of a system for detecting a memory error according to the present disclosure.

FIG. 1 is a flow chart of a method for detecting a memory error according to the present disclosure. A method for detecting a memory error includes, but is not limited to, Steps S1-S3.

Step S1: An application platform is taken as a test engine of a memory test device, the application platform being provided with a system memory.

It is to be noted that the application platform in the embodiment includes various platforms running an application program, such as a social platform, an office platform, an enterprise management platform, and a service platform. There are no limits made thereto. Hence, a system memory of each platform is used actually. However, according to the prior art, there is a certain time difference from an error of the system memory to time when the application platform is affected in operation, and the memory error cannot be discovered timely. Since the memory error occurs occasionally, the error of the system memory cannot be effectively reproduced in the prior art, and a node or a reason of the memory error cannot be accurately analyzed. In view of this, a connection between the memory test device and the application platform is established in the embodiment. Specifically, by providing a special interface on the memory test device to connect the application platform, and invoking the application platform as a test engine of a tested memory, the tested memory and the system memory are located in a completely same digital environment. Hence, all tested memory devices with an error due to program running on the application platform can be reproduced. In addition, in case of an error of the tested memory, although the application platform hasn't reflected the error of the system memory, the system memory can be detected timely through the error of the tested memory to prevent a larger loss.

Step S2: The memory test device captures a data flow of an actual application program of the application platform on a memory transmission line in a manner including a logic analyzer.

It is to be noted that the memory test device preferably captures the data flow of the actual application program of the application platform on the memory transmission line with the logic analyzer. Certainly, it may be understood that the memory test device may further capture the data flow of the actual application program of the application platform on the memory transmission line in other manners. There are no limits made thereto.

In Step S2, the data flow includes at least a command, an address and/or a data sequence. The command includes at least a read command and/or a write command.

In a possible implementation for Step S2, when the write command on the memory transmission line is captured, the memory test device takes a processed data flow as a memory test vector to test a tested memory device, which includes:

The memory test device transmits the captured write command to a transmission line of the tested memory device according to a data writing address, a data writing sequence and a data writing time sequence of the application platform for testing; and the logic analyzer embedded into the memory test device records a data transmission process.

Certainly, it may be understood that except the write command, a captured command may further be other non-read commands, such as a memory usage query command, a memory capacity query command, a resource occupation query command of each process. There are no specific limits made thereto. Upon reception of the other non-read commands, the memory test device and the logic analyzer process the other non-read commands in a same manner as the write command, which is not repeated herein.

For example, when the write command on the memory transmission line is captured, a data writing command of the application platform is transmitted to the present tested memory device. For instance, if the application platform writes $XXXX to an address YYYY of the system memory, the memory test device also writes $XXXX to an address YYYY of the tested memory, with a data writing sequence same as that of the application platform.

Based on the above disclosed content, the captured write command is transmitted to the transmission line of the tested memory device according to the data writing address, the data writing sequence and the data writing time sequence of the application platform for testing. If data writing is failed, the tested memory may have an error, and the corresponding system memory may also have an error, thereby realizing synchronous detection and reproduction of the memory error.

In a possible implementation for Step S2, when the read command on the memory transmission line is captured, the memory test device takes a processed data flow as a memory test vector to test a tested memory device, which includes:

Step S21: The memory test device transmits the read command and a data reading address captured from the application platform to the transmission line of the tested memory device according to a captured sequence and a captured time sequence.

Step S22: The memory test device receives response data of the application platform for the read command and response data of the tested memory device for the read command.

Step S23: Stored information in the two sets of the response data is compared. It is determined that the tested memory device has an error if the stored information is inconsistent, and error information is recorded. The error information includes, but is not limited, to an error address, an error data line and error time.

In a possible implementation, after the memory test device captures a data flow of an actual application program of the application platform on a memory transmission line in a manner including a logic analyzer, the method further includes:

The memory test device stores the data flow to a circular buffer region.

The circular buffer region is a buffer system. A size of the buffer system may be provided as required. For example, if the buffer system has a size of 64 K deep, the buffer system can store 64 K (clock) historical data of the system memory, for ease of reproduction and query.

After the memory test device takes a processed data flow as a memory test vector to test a tested memory device, the method further includes:

(2) The memory test device stops updating the circular buffer region and a pointer of the circular buffer region when it is detected that the tested memory device has an error, and a present error node and historical data of the circular buffer region are recorded.

Specifically, the memory test device stops updating the circular buffer region, which includes:

The memory test device stops embedding a logic address in the circular buffer region. Embedding the logic address is stopped by the memory error and/or a test environment. Therefore, the memory error can be tracked deeply. For example, an error address/a dequeue (DQ) (error address or an error pseudo-operation command) is confirmed to track a written history.

Based on the above disclosed content, in the case of the memory error, the pointer and a data caching space of the circular buffer region are not updated. The pointer accurately records a node with the memory error. The buffer region completely records 64 K clock historical data before occurrence of the error.

In a specific implementation, after the present error node and the historical data of the circular buffer region are recorded, the method further includes:

The logic analyzer displays the present error node and the historical data of the circular buffer region. By this time, the logic analyzer is equivalent to a high-order logic analyzer. With a lower cost, the logic analyzer realizes an analysis function of the high-order logic analyzer, and can clearly display the error node and the historical data.

In a specific implementation, after the memory test device takes a processed data flow as a memory test vector to test a tested memory device, the method further includes:

The memory test device outputs a trigger signal, thereby triggering a DSO to track a signal waveform when the memory error occurs. Therefore, a simulation environment when the memory has the error can be tracked. When the simulation environment has an error, a simulation environment of the tested memory can be adjusted.

Step S3: The memory test device takes a processed data flow as a memory test vector to test a tested memory device, thereby reproducing a memory error of the application platform or the application program on the memory test device.

It is to be noted that there may be one or more tested memory devices in the embodiment of the present disclosure. By providing one test vector source for a plurality of the tested memory devices, the test density is improved, and the detection cost is lowered.

Based on the above content, the method is implemented by taking an application platform as a test engine of a memory test device, the application platform being provided with a system memory; and the method includes: capturing, by the memory test device, a data flow of an actual application program of the application platform on a memory transmission line in a manner including a logic analyzer; and taking, by the memory test device, a processed data flow as a memory test vector to test a tested memory device. With the application platform as the test engine of the memory test device, the tested memory device connected to the memory test device and the system memory in the application platform are located in a completely same digital environment, thereby reproducing all tested memory devices with an error in the application platform, and improving a reproduction rate of the memory error. By storing the captured data flow in the circular buffer region, and recording a node with an error and historical data in case of the memory error, the method accurately locates the node with the memory error and the data.

According to another aspect, the present disclosure provides an apparatus for detecting a memory error, including: an engine setting module, a data capturing module, and a memory testing module.

The engine setting module is configured to take an application platform as a test engine of a memory test device, the application platform being provided with a system memory.

The data capturing module is configured to capture, by the memory test device, a data flow of an actual application program of the application platform on a memory transmission line in a manner including a logic analyzer.

The memory testing module is configured to take, by the memory test device, a processed data flow as a memory test vector to test a tested memory device, thereby reproducing a memory error of the application platform or the application program on the memory test device.

The working process, working detail and technical effect of the apparatus provided by the second aspect of the embodiment may refer to the method in the first aspect or any possible implementation of the first aspect, and will not be repeated herein.

According to a third aspect, the present disclosure provides a system using the method in any possible implementation of the first aspect, including the memory test device. The memory test device is connected to the application platform and the present tested memory device.

According to a third aspect, the present disclosure provides a system using the method in any possible implementation of the first aspect, including the memory test device. The memory test device is connected to the application platform and the tested memory device.

The application platform is provided with the system memory and runs the application program. The memory test device is configured to capture the data flow on the memory transmission line in the application platform, and take the processed data flow as the memory test vector to test the tested memory device.

The working process, working detail and technical effect of the system provided by the third aspect of the embodiment may refer to the method in the first aspect or any possible implementation of the first aspect, and will not be repeated herein.

According to a fourth aspect, the present disclosure provides a computer device, including a memory, a processor, and a transceiver that are sequentially in communication connection. The memory is configured to store a computer program. The transceiver is configured to transmit and receive information. The processor is configured to read the computer program to execute the method in any possible implementation of the first aspect.

Specifically, for example, the memory may include, but is not limited to, a random-access memory (RAM), a read-only memory (ROM), a flash memory, a first input first output (FIFO) and/or a first input last output (FILO), etc. The processor may be, but is not limited to, an STM32F105-series microprocessor. The transceiver may be, but is not limited to, a wireless fidelity (WiFi) wireless transceiver, a Bluetooth wireless transceiver, a general packet radio service (GPRS) wireless transceiver and/or a ZigBee (a low power local area network protocol based on an IEEE802.15.4 standard) wireless transceiver, etc. In addition, the computer device may further include, but is not limited to, a power module, a display screen and other necessary components.

The working process, working detail and technical effect of the computer device provided by the fourth aspect of the embodiment may refer to the method in the first aspect or any possible implementation of the first aspect, and will not be repeated herein.

According to a fifth aspect, the present disclosure provides a computer-readable storage medium. An instruction is stored on the computer-readable storage medium. The instruction runs on a computer to implement the method in any possible implementation of the first aspect.

The computer-readable storage medium refers to a carrier that stores data, which may include, but is not limited to, a floppy disk, an optical disk, a hard disk, a flash memory, a USB flash drive, and/or a memory stick. The computer may be a general-purpose computer, a dedicated computer, a computer network, or another programmable devices.

The working process, working detail and technical effect of the computer-readable storage medium provided by the fifth aspect of the embodiment may refer to the method in the first aspect or any possible implementation of the first aspect, and will not be repeated herein.

According to a sixth aspect, the present disclosure provides a computer program product including an instruction. When an instruction runs on a computer, the computer implements the method for detecting a memory error in any possible implementation of the first aspect.

The working process, working detail and technical effect of the computer program product provided by the sixth aspect of the embodiment may refer to the method in the first aspect or any possible implementation of the first aspect, and will not be repeated herein.

Finally, it should be noted that the above described are only preferred embodiments of the present disclosure and are not intended to limit the present disclosure. Any modification, equivalent substitution, improvement, etc. within the spirit and principles of the present disclosure shall fall within the scope of protection of the present disclosure.

What is claimed is:

1. A method for detecting a memory error, comprising:
taking an application platform as a test engine of a memory test device, the application platform being provided with a system memory;
capturing, by the memory test device, a data flow of an actual application program of the application platform on a memory transmission line in a manner comprising a logic analyzer; and
taking, by the memory test device, a processed data flow as a memory test vector to test a tested memory device, thereby reproducing a memory error of the application platform or the application program on the memory test device, wherein
the data flow comprises at least a command, and the command comprises at least a read command and a write command;
when the write command on the memory transmission line is captured, the taking, by the memory test device, a processed data flow as a memory test vector to test a tested memory device comprises:
transmitting, by the memory test device, the captured write command to a transmission line of the tested memory device according to a data writing address, a data writing sequence and a data writing time sequence of the application platform for testing; and recording, by the logic analyzer embedded into the memory test device, a data transmission process;
when the read command on the memory transmission line is captured, the taking, by the memory test device, a processed data flow as a memory test vector to test a tested memory device comprises:
transmitting, by the memory test device, the read command and a data reading address captured from the application platform to the transmission line of the tested memory device according to a captured sequence and a captured time sequence;
receiving, by the memory test device, response data of the application platform for the read command and response data of the tested memory device for the read command; and
comparing stored information in the two sets of the response data, determining that the tested memory device has an error if the stored information is inconsistent, and recording error information;
after the capturing, by the memory test device, a data flow of an actual application program of the application platform on a memory transmission line in a manner comprising a logic analyzer, the method further comprises:
storing, by the memory test device, the data flow in a circular buffer region; and
after the taking, by the memory test device, a processed data flow as a memory test vector to test a tested memory device, the method further comprises:
stopping, by the memory test device, updating the circular buffer region and a pointer of the circular buffer region when detecting that the tested memory device has an error, and recording a present error node and historical data of the circular buffer region.

2. The method for detecting a memory error according to claim 1, wherein the data flow further comprises at least an address and/or a data sequence.

3. The method for detecting a memory error according to claim 1, after the recording a present error node and historical data of the circular buffer region, further comprising:
displaying, by the logic analyzer of the memory test device, the present error node and the historical data of the circular buffer region.

4. The method for detecting a memory error according to claim 1, wherein the stopping, by the memory test device, updating the circular buffer region comprises:
stopping, by the memory test device, embedding a logic address in the circular buffer region, wherein embedding the logic address is stopped by the memory error and/or a test environment.

5. The method for detecting a memory error according to claim 1, after the taking, by the memory test device, a processed data flow as a memory test vector to test a tested memory device, further comprising:
outputting, by the memory test device, a trigger signal, thereby triggering a digital storage oscilloscope (DSO) to track a signal waveform when the memory error occurs.

6. A system using the method according to claim 1, comprising the memory test device, wherein the memory test device is connected to the application platform and the tested memory device; and
the application platform is provided with the system memory and runs the application program; and the memory test device is configured to capture the data flow on the memory transmission line in the application platform, and take the processed data flow as the memory test vector to test the tested memory device.

7. The system according to claim 6, wherein the data flow further comprises at least an address and/or a data sequence.

8. The system according to claim 6, wherein the method for detecting a memory error, after the recording a present error node and historical data of the circular buffer region, further comprises:
displaying, by the logic analyzer of the memory test device, the present error node and the historical data of the circular buffer region.

9. The system according to claim 6, wherein the stopping, by the memory test device, updating the circular buffer region comprises:
stopping, by the memory test device, embedding a logic address in the circular buffer region, wherein embedding the logic address is stopped by the memory error and/or a test environment.

10. The system according to claim 6, wherein the method for detecting a memory error, after the taking, by the memory test device, a processed data flow as a memory test vector to test a tested memory device, further comprises:
outputting, by the memory test device, a trigger signal, thereby triggering a digital storage oscilloscope (DSO) to track a signal waveform when the memory error occurs.

11. A computer device, comprising a memory, a processor, and a transceiver that are sequentially in communication connection, wherein the memory is configured to store a computer program; the transceiver is configured to transmit and receive information; and the processor is configured to read the computer program to execute the method for detecting a memory error according to claim 1.

12. The computer device according to claim 11, wherein the data flow further comprises at least an address and/or a data sequence.

13. The computer device according to claim 11, wherein the method for detecting a memory error, after the recording a present error node and historical data of the circular buffer region, further comprises:
   displaying, by the logic analyzer of the memory test device, the present error node and the historical data of the circular buffer region.

14. The computer device according to claim 11, wherein the stopping, by the memory test device, updating the circular buffer region comprises:
   stopping, by the memory test device, embedding a logic address in the circular buffer region, wherein embedding the logic address is stopped by the memory error and/or a test environment.

15. The computer device according to claim 11, wherein the method for detecting a memory error, after the taking, by the memory test device, a processed data flow as a memory test vector to test a tested memory device, further comprises:
   outputting, by the memory test device, a trigger signal, thereby triggering a digital storage oscilloscope (DSO) to track a signal waveform when the memory error occurs.

* * * * *